(12) United States Patent
Horstmann et al.

(10) Patent No.: US 6,344,397 B1
(45) Date of Patent: Feb. 5, 2002

(54) SEMICONDUCTOR DEVICE HAVING A GATE ELECTRODE WITH ENHANCED ELECTRICAL CHARACTERISTICS

(75) Inventors: Manfred Horstmann, Dresden; Karsten Wieczorek, Reichenberg-Boxdorf; Bernd Engelmann, Dresden, all of (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/477,960

(22) Filed: Jan. 5, 2000

(51) Int. Cl.[7] ............................................... H01L 21/336
(52) U.S. Cl. ...................... 438/300; 438/303; 438/305
(58) Field of Search .................................. 438/300, 301, 438/302, 303, 304, 305, 270, 271, 272; 257/522, 408–412

(56) References Cited

U.S. PATENT DOCUMENTS

| | | | |
|---|---|---|---|
| 4,897,368 A | | 1/1990 | Kobushi et al. |
| 5,034,348 A | | 7/1991 | Hartswick et al. |
| 5,434,093 A | * | 7/1995 | Chau et al. .................. 438/300 |
| 5,447,875 A | | 9/1995 | Moslehi |
| 5,937,325 A | | 8/1999 | Ishida ......................... 438/655 |
| 6,064,107 A | * | 6/2000 | Yeh et al. ..................... 257/522 |
| 6,100,173 A | | 8/2000 | Gardner et al. ............. 438/592 |
| 6,136,705 A | | 10/2000 | Blair .......................... 438/682 |
| 6,187,617 B1 | | 2/2001 | Gauthier, Jr. et al. ....... 438/197 |

OTHER PUBLICATIONS

Goto et al., "Optimization of Salicide Processes for sub 0.1–μm CMOS Devices," *1994 Symposium on VLSI Technology Digest of Technical Papers*, pp. 119–120, Apr. 1994.
Sohn et al., "High Thermal Stability and Low Junction Leakage Current of Ti Capped Co Salicide and its Feasibility for High Thermal Budget CMOS Devices," Mar. 1998.
Goto et al., "A New Leakage Mechanism of Co Salicide and Optimized Process Conditions," *IEEE Transactions on Electron Devices*, vol. 46, No. 1, p. 117, Jan. 1999.

* cited by examiner

*Primary Examiner*—David Nelms
*Assistant Examiner*—Dung A Le
(74) *Attorney, Agent, or Firm*—Williams, Morgan & Amerson, P.C.

(57) ABSTRACT

In one illustrative embodiment, the present invention is directed to forming a masking layer (104) above a semiconducting substrate (102), forming an opening (105) in the masking layer (104), forming sidewall spacers (109) that define an exposed surface of said substrate lying between the sidewall spacers (109), and forming a layer of gate dielectric material (108) on the exposed surface of the substrate. The method further comprises forming a layer of polysilicon in the opening (105) and on the gate dielectric layer (108), removing portions of the polysilicon layer lying outside the opening (105) to define a gate electrode (111), forming a layer of refractory metal above the gate electrode (111), converting at least some of the refractory metal layer to a metal silicide region (112) above the gate electrode (111), and removing the masking layer (104).

31 Claims, 3 Drawing Sheets

SEMICONDUCTOR DEVICE HAVING A GATE ELECTRODE WITH ENHANCED ELECTRICAL CHARACTERISTICS

BACKGROUND OF THE INVENTION

1. Field of the Invention

The present invention relates to fabrication of integrated circuit devices, and, more particularly, to a method of forming a semiconductor device with improved electrical characteristics.

2. Description of the Related Art

In the field of semiconductor integrated circuit devices, the dimensions/sizes of various design features are being steadily decreased for a variety of reasons. For example, design feature sizes are being decreased to achieve higher packaging densities for improving device performance, and to improve electrical performance characteristics of the semiconductor devices, such as a field effect transistor.

Complex digital circuits, such as central processing units (CPUs) and the like, demand fast switching transistors. All other things, being equal, the shorter the channel length of a transistor, the faster it will operate. Accordingly, there is a constant drive to reduce the channel-length on modern transistor devices. For example, the longitudinal dimension of a gate electrode of a transistor, i.e., the gate width, may extend to 20 µm, whereas the distance between the drain and source, i.e., the channel length or gate length, may be reduced to 0.2 µm or below.

As the channel length has been reduced to obtain the desired switching characteristic, the length of the gate electrode has also been reduced. Since the gate electrode may only be electrically connected at one end, the electrical charges used to establish a transverse electrical field for forming the channel between the drain region and the source region of the transistor have to be transported along the entire width of the gate electrode. Given the small transverse dimension (length) of the gate electrode, the electrical resistance is relatively high, which may result in higher RC-delay time-constants. Hence, generation of the transverse electrical field used to fully open the channel is delayed, thereby deteriorating the switching time of the transistor. As a consequence, the rise and fall times of the electrical signals are increased and the operating frequency, i.e., the clock frequency, is reduced. Thus, the switching time of the transistor is no longer limited by the drain and source characteristics, but rather, significantly depends on the delay associated with signal propagation along the gate electrode, i.e., the transistor performance depends, at least in part, on the resistance of the gate electrode in the longitudinal direction of the gate electrode, i.e., in the gate width direction.

The manufacturing process of integrated circuits (ICs) involves the fabrication of numerous insulated gate field effect transistors, such as metal oxide semiconductor field effect transistors (MOSFET). There is a constant drive to continually reduce the feature sizes of the transistor structures to increase the integration density and improve device performance with respect to, for example, signal processing time and power consumption. Therefore, there is a demand for ever improved efficient, reliable and relatively inexpensive methods for patterning the structural features and layers in an integrated circuit device that are suitable for use in the mass production of such devices. Optical photolithography is generally used as a standard method for feature definition in such devices in mass production settings. Currently available photolithography steppers using high numerical aperture lenses and deep ultraviolet (UV) exposure light are, for instance, capable of reliably printing feature sizes as small as 0.2 µm.

The formation of the gate electrode is a critical step in the manufacturing process of a field effect transistor ("FET"). It is desirable that the gate length dimension, i.e., the lateral extension of the gate electrode between the source and drain electrodes of the FET, be reduced to sizes approaching or even exceeding the resolution limit of the optical imaging systems used for patterning the device features. In a field effect transistor, such as a MOSFET, the gate electrode is used to control an underlying channel formed in the semiconductor substrate between a source region and a drain region. Channel, source region, and drain region are formed in, on, or over a semiconductor substrate which is doped inversely to the drain and source regions. The gate electrode is separated from the channel, the source region and the drain region by a thin insulating gate dielectric layer, generally a layer comprised of silicon dioxide.

During operation, a voltage is supplied to the gate electrode to create an electric field between the gate electrode and the source and drain regions affecting conductivity in the channel region of the substrate beneath the gate conductor. Besides the desired transistor current control function, the gate electrode, the gate dielectric layer, and the regions underlying the gate dielectric layer also act as a capacitor. The amount of this parasitic capacitance depends on the feature size of the gate electrode. In many integrated circuit applications, the transistors are operated in a switching mode with clock frequencies currently as high as 400–600 MHz, and greater clock speeds are envisioned in the future. In this operation mode, the parasitic capacitance has to be continuously charged and discharged, which significantly affects signal performance and power consumption of the device.

An illustrative example of forming a gate electrode according to a typical prior art process will be described with reference to FIGS. 1A–1C. In FIG. 1A, shallow trench isolations 1 are formed in a substrate 2 to define an electrically active region 30 in which a channel, drain and source regions are to be formed. Subsequently, a thin gate dielectric layer 3 comprised of silicon dioxide is grown by, for example, furnace processing. Then, a polysilicon layer 4A is blanket-deposited, and a photoresist mask 5 is patterned on the polysilicon layer 4A. The patterning of the photoresist mask 5 is typically performed by deep ultraviolet (DUV) photolithography, which is one method used to achieve the smallest feature dimensions of an integrated circuit device without compromising the required throughput. In a subsequent etching step, portions of the polysilicon layer 4A are removed to form a gate electrode 4 (see FIG. 1B).

FIG. 1B is a cross-sectional view of the transistor structure after the photoresist mask 5, portions of the polysilicon layer 4A and the gate dielectric layer 3 have been removed. Subsequently, as shown in FIG. 1C, lightly doped drain (LDD) regions 8 are formed by an ion implantation process with a low dose of dopant material. The implanted dopant ions are diffused by rapid thermal annealing (RTA) so as to partially extend in the area below the gate dielectric layer 3. With reference to FIG. 1C, sidewall spacers 6 are formed adjacent the gate electrode 4 by forming a layer of spacer material, e.g., silicon dioxide, and performing an anisotropic etching process. Next, a further implantation step with a higher dose of dopant atoms is performed to generate the final drain and source regions 7.

In FIG. 1C, a transistor structure fabricated according to conventional methods is shown wherein the drain and source regions 7 are limited by lightly doped drain regions 8, which connect to a channel 9. The transverse dimension of the gate electrode 4 defines a gate length 10. For the sake of clarity, the person skilled in the art will appreciate that the above mentioned processes are merely schematically described. In particular, those skilled in the art will understand that the DUV photolithographical step involves certain sub steps, such as providing an anti-reflecting coating, which are not specifically recited above.

As mentioned above, the gate length 10 is defined by the gate electrode 4, which, in turn, is defined by the DUV photolithographical step and the subsequent etching of the layer from which the gate electrode 4 is formed. This can be problematic if the gate length dimension, i.e., the dimension indicated by the arrow 10, is reduced to less than a size that can be directly and reliably patterned by conventional photolithography techniques. Additionally, etching processes used to form the gate electrode 4 can lead to variations in the gate length of devices fabricated on different substrate wafers, or different locations within a single wafer, or even to variations of the gate length along a gate width direction. This, in turn, may result in strong variations in drive current and accordingly in strong variations in the electrical characteristics and performance of the transistors. Moreover, any lithographic process for achieving such further reduced gate length is very cost-intensive and complex.

Therefore, since the length 10 of the gate electrode 4 significantly influences the electrical characteristics of the transistor, it is important to provide a method of reliably and reproducibly forming gate electrodes to minimize variations in the electrical characteristics of integrated circuits. The formation of gate electrodes in the sub-quarter micron range, to the extent this is possible, conventionally requires especially costly and complex patterning processes using the most up to date patterning tools, such as the previously described deep ultraviolet (DUV) photolithography steppers.

The present invention is directed to a method of making a semiconductor device that solves, or at least reduces, some or all of the aforementioned problems.

SUMMARY OF THE INVENTION

The present invention is directed to a method of making a semiconductor device having improved electrical performance characteristics. In one illustrative embodiment, the method comprises forming a masking layer above a semiconducting substrate, forming an opening in the masking layer that is defined by at least two sidewalls, forming sidewall spacers adjacent the sidewalls of the opening that define an exposed surface of the substrate lying between the spacers, and forming a gate dielectric layer on the exposed silicon surface. The method further comprises forming a layer of polysilicon in the opening and above the gate dielectric layer, removing the layer of polysilicon lying outside the opening, forming a layer of refractory metal above the layer of polysilicon in the opening, converting at least some of the layer of refractory metal to a metal silicide, and removing the masking layer.

BRIEF DESCRIPTION OF THE DRAWINGS

The invention may be understood by reference to the following description taken in conjunction with the accompanying drawings, in which like reference numerals identify like elements, and in which.

Figure 1A:
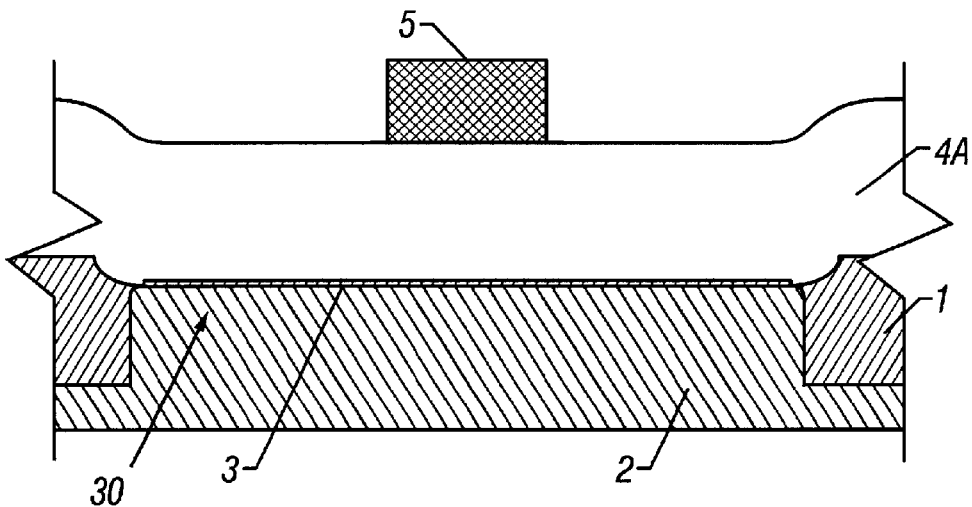
FIGS. 1A–1C are cross-sectional views of a prior art field effect transistor during various states of the formation of the transistor.
Figure 1B:
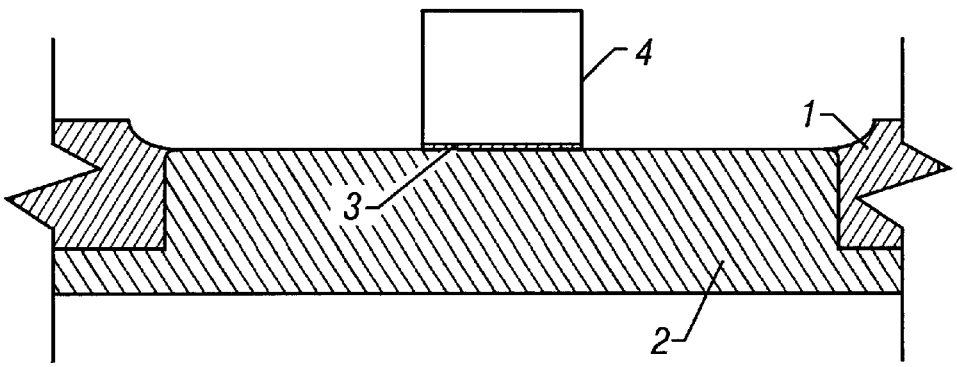
Figure 1C:
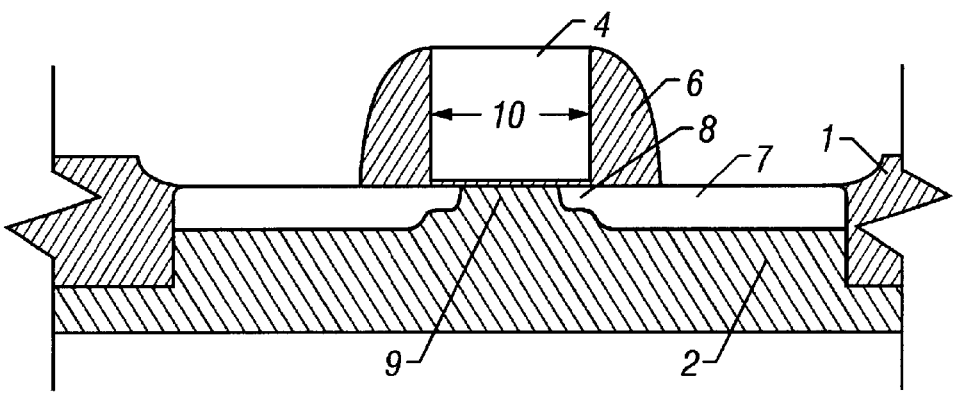

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 2–4. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those feature sizes on fabricated devices. Nevertheless, the attached drawings are included to describe and explain illustrative examples of the present invention.

In general, the present invention is directed to a method of making a semiconductor device having improved electrical characteristics. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, etc.

Figure 2A:
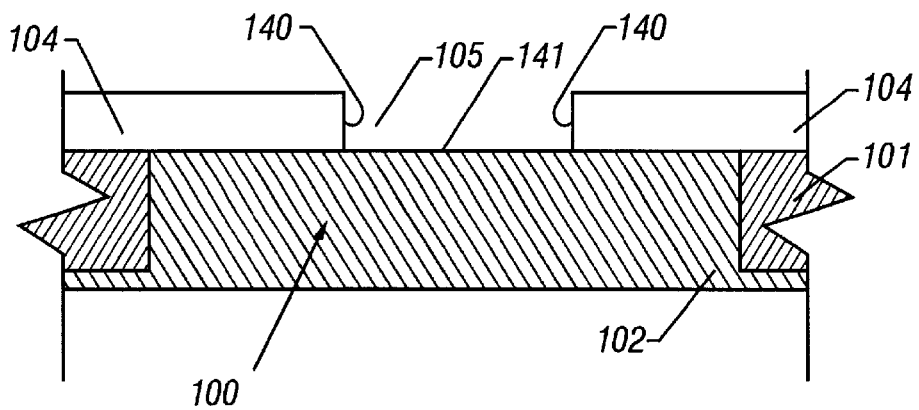
FIG. 2A is a cross-sectional view of an illustrative transistor fabricated in accordance with one illustrative embodiment of the present invention.

In FIG. 2A, an electrically active region 100 where the transistor device is to be formed is bounded by isolating shallow trenches 101 formed in a silicon substrate 102. Over the electrically active region 100 and the shallow trenches 101, a mask layer 104 substantially consisting of silicon nitride or other like material is formed. Within the mask layer 104, an opening 105 is patterned by standard photolithography and etching processes.

The mask layer 104 may be formed to any desired thickness. As will be described more fully below, the thickness of the mask layer 104 may be used to assist in defining a very thick gate electrode having a very thick metal silicide region above the gate electrode. In an illustrative embodiment, the mask layer 104 may have a thickness ranging from 1000–3000 Å, although thicker layers may be used with the present invention. In one particularly illustrative embodiment, the mask layer 104 may be comprised of silicon nitride and may have a thickness of approximately 1500 Å.

Figure 2B:
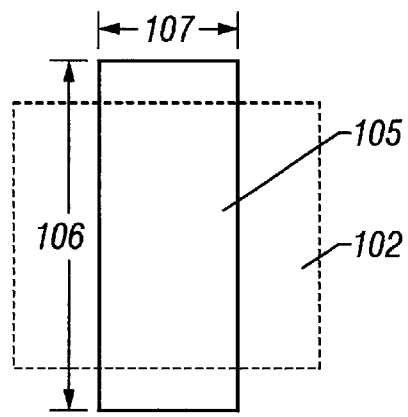
FIG. 2B is a top view of the device shown in FIG. 2A.

FIG. 2B is a top view of the arrangement shown in FIG. 2A. As can be seen from FIG. 2B, the opening 105 substantially forms a rectangle with a first distance 107 and a second distance 106, wherein the first distance 107 is smaller than the second distance 106. The opening 105 defines a plurality of sidewalls 140 that are substantially of a step-like structure.

Figure 3:
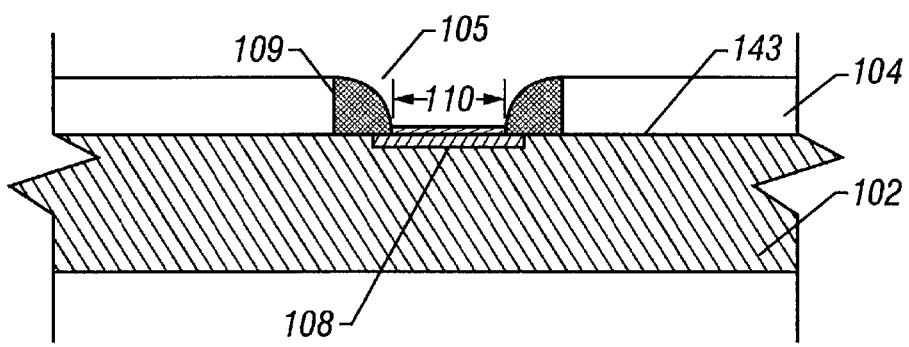
FIG. 3 is a cross-sectional view of the illustrative transistor after the gate length is defined according to one illustrative embodiment of the present invention.

Next, as shown in FIG. 3, a plurality of sidewall spacers 109 are formed in the opening 105. The sidewall spacers 109 may be formed by forming a layer of the appropriate spacer material and thereafter etching the layer to define the sidewall spacers 109. For example, a silicon dioxide layer may be deposited over the mask layer 104 and the opening 105 by a chemical vapor deposition (CVD) process and subsequently anisotropically etched by a reactive ion etching (RIE) process. The sidewall spacers 109 expose a portion of the surface 143 of the substrate 102 lying between the sidewall spacers 109.

The mask layer 104 and the sidewall spacers 109 may be comprised of a variety of materials, such as silicon dioxide ($SiO_2$), silicon nitride ($Si_3N_4$), etc. These material are generally used as dielectric materials in semiconductor processing technology and, therefore, their properties and handling characteristics are well known. In one particularly illustrative embodiment, the mask layer 104 and the sidewall spacers 109 are comprised of different materials. Thereby, etch selectivity may be employed to remove the mask layer 104 while leaving the sidewall spacers 109 in place. The sidewall spacers 109 may subsequently be used in forming the LDD structure of the source/drain regions.

In a further step, a gate dielectric layer 108 consisting of, for example, silicon dioxide ($SiO_2$), is formed on the exposed surface of the substrate 102 between the sidewall spacers 109. For example, the gate dielectric layer 108 comprised of silicon dioxide may be thermally grown by furnace processing on the bottom 141 of the opening 105. The height of the sidewall spacers 109 is defined by the thickness of the mask layer 104, and the thickness of the sidewall spacers 109 may be adjusted by the thickness of the initial layer of spacer material which has been deposited and etched as described above.

The remaining distance of the opening 105 in the direction of the first distance 107 is determined by the difference of the first distance 107 and the thickness of the spacers 109. Consequently, the remaining distance of the opening 105 represents a gate length 110 of a gate electrode to be formed by filling opening 105 with a gate electrode material in subsequent steps.

It should be noted that, contrary to the conventional method, the gate length 110 in accordance with the present invention may be defined without any DUV photolithographical step and the associated etching step, thereby improving the efficiency of the fabrication process. Furthermore, as the gate length 110 is defined by the first distance 107 of opening 105, which is accurately adjustable since no critical photolithographical step is required, and the thickness of the spacers 109, which is controllable by the thickness of the deposited layer of spacer material, gate length variations can be remarkably reduced even if gate dimensions in the sub-micron range are required.

Figure 4A:
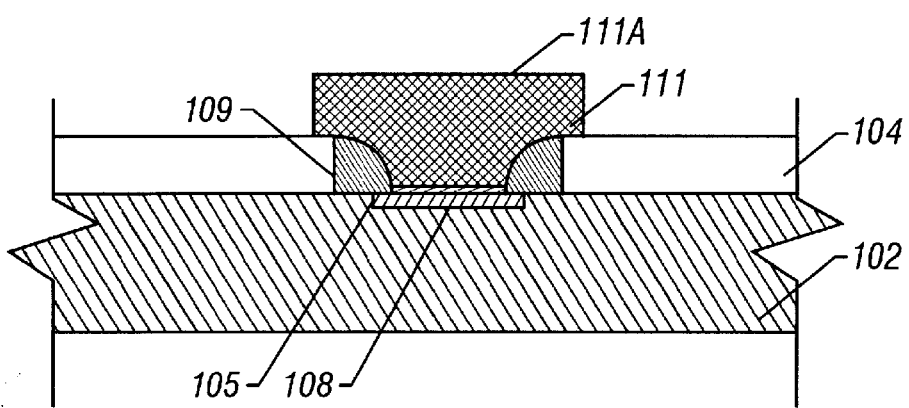
FIGS. 4A–4D are cross-sectional views of the transistor structure according to one illustrative embodiment of the present invention after the gate length has been defined.
Figure 4B:
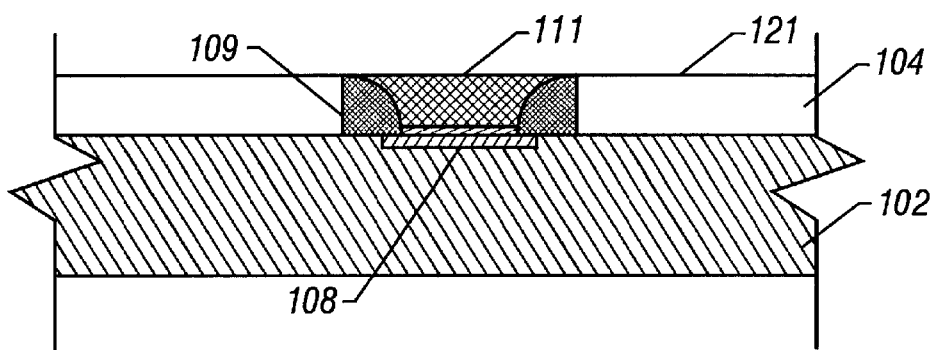
Figure 4C:
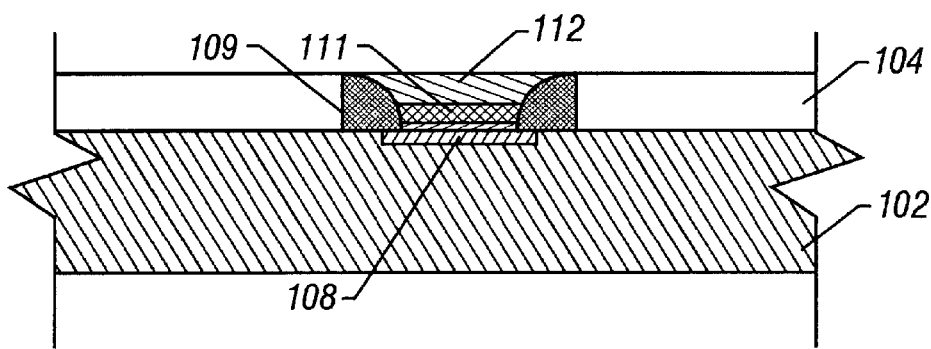

FIGS. 4A–4C schematically show cross-sectional views of various stages in the completion of the MOS transistor having a fully self-aligned gate length in accordance with one embodiment of the present invention. In the illustrative embodiment, a layer of polycrystalline silicon (not shown) is deposited over the opening 105 and the mask layer 104 thereby filling the opening 105 with polycrystalline silicon. Next, in one embodiment of the present invention, excess material of the deposited polycrystalline silicon is removed by performing a chemical mechanical polishing (CMP) operation over the entire surface of the deposited layer of polycrystalline silicon, thereby planarizing a surface 121 of the MOS structure, as is shown in FIG. 4B. This results in the gate electrode 111 as depicted in FIG. 4B.

In one particularly illustrative embodiment of the present invention, the layer of polycrystalline silicon deposited over the opening 105 and the mask layer 104 (not shown) is patterned by a standard photolithographical step and a subsequent etching process, thereby forming the gate electrode 111, as is shown in FIG. 4A. Thereafter, the excess material of the gate electrode 111 is subsequently removed by CMP, which is merely performed on the small surface 111A of the patterned gate electrode 111, so that the effect of dishing, which may occur during polishing of the entire deposited layer of polycrystalline silicon is significantly reduced.

In a further step, depicted in FIG. 4C, silicidation of the polycrystalline silicon gate electrode 111 is performed to lower the electrical resistance of the gate electrode 111. A layer of refractory metal (not shown), e.g., cobalt, titanium, platinum, nickel, etc., is formed above the gate electrode 111 and subsequently annealed to form a metal silicide region 112, e.g., cobalt silicide, titanium silicide, platinum silicide, nickel silicide, etc., above the gate electrode 111. The silicidation process only occurs on the polycrystalline silicon gate electrode 111. FIG. 4C shows a schematic cross-section of the MOS structure after the above-mentioned steps are performed, wherein the gate electrode 111 now comprises a metal silicide layer 112 in its upper portion. In one illustrative embodiment where the layer of polycrystalline silicon is formed to a thickness of approximately 1500 Å, the metal silicide layer 112 may be comprised of titanium silicide having a thickness of approximately 1000–1200 Å A with the remaining portion of the polysilicon gate electrode 111 positioned between the metal silicide layer 112 and the gate dielectric layer 108 being approximately 500–300 Å,. That is, using the present invention, the metal silicide region 112 may have a thickness that is at least two times greater than the thickness of the portion of the gate electrode 111 comprised of polysilicon. In one illustrative embodiment, the metal silicide region 112 has a thickness that ranges from approximately 2–4 times greater than the thickness of the polysilicon portion of the gate electrode 111.

In one particularly illustrative embodiment, the polysilicon gate electrode 111 positioned between the metal silicide layer 112 and the gate dielectric layer 108 has a thickness of approximately 500 Å. This spacing is provided to reduce the chances of excessive current leakage during operation of the device. Of course, the illustrative thicknesses described above may need to be varied depending upon the particular refractory metal selected for use in the present invention and the particular device under construction.

Figure 4D:
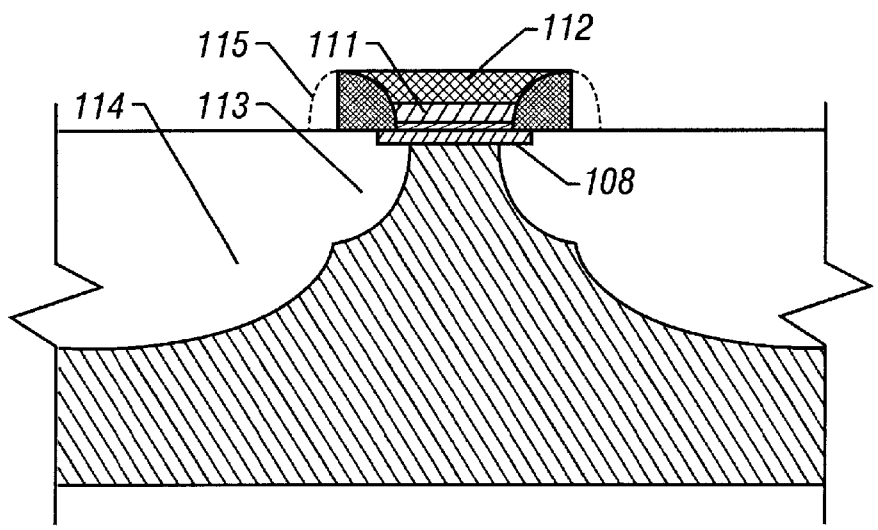

In FIG. 4D, the mask layer 104 has been removed by selective wet etching. Next, lightly doped source and drain regions 113 are formed by ion implantation with a low dose, wherein the ions are driven into the portions covered by the spacers 109 by RTA cycles using a relatively high temperature. In a second implantation step with a high dose and subsequent RTA cycles with a low temperature, highly doped drain and source regions 114 are formed adjacent the lightly doped drain (LDD) areas 113. Alternatively, or in combination with the aforementioned procedure, a second set of spacers 115 may be formed adjacent the spacers 109 by depositing a layer of spacer material, e.g., silicon dioxide, and then performing an anisotropic etching step, thereby obtaining an implantation mask covering a portion of the low-dose implantation region of the preceding implantation step for forming larger LDD areas. Subsequently, a second implantation step, as described above, is carried out to form the highly doped drain and source regions.

According to the present invention, a transistor may be formed having improved electrical performance characteristics. In particular, through use of the present invention, a transistor may be formed having a very thick silicide region formed above the gate electrode of the device. This metal silicide region acts to reduce the resistance of the gate electrode, thereby increasing transistor performance.

Additionally, in accordance with the present invention, a MOS transistor in an integrated circuit is formed wherein no critical and cost-intensive DUV photolithographic step is required while still a gate length near or even below the resolution limit of optical photolithography is achieved. Although in the embodiment described above, silicon nitride ($Si_3N_4$) is used for the mask layer 104, other materials such as silicon dioxide may be employed for this purpose. Furthermore, the step of removing the mask layer 104 may also be performed by standard lithography and subsequent anisotropic etching. In this embodiment, polycrystalline silicon is used as a gate electrode material but any other material that is appropriate for the semiconductor processing operation described herein may be selected.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:

forming a masking layer above a semiconducting substrate;

forming an opening in said masking layer, said opening defined by at least two opposing sidewalls;

forming sidewall spacers adjacent said opposing sidewalls of said opening, said sidewall spacers partially defining an exposed surface on said substrate between said sidewall spacers;

forming a gate dielectric layer on said exposed surface of said substrate;

forming a layer of polysilicon in said opening and above said gate dielectric layer;

removing the layer of polysilicon in areas lying outside the opening in said masking layer;

forming a layer comprised of a refractory metal above said layer of polysilicon in said opening;

converting at least some of said layer of refractory metal to a metal silicide region within said opening; and removing said masking layer.

2. The method of claim 1, wherein forming a masking layer above a semiconducting substrate comprises forming a masking layer comprised of at least one of silicon dioxide and silicon nitride above a semiconducting substrate.

3. The method of claim 1, wherein forming an opening in said masking layer, aid opening defined by at least two opposing sidewalls, comprises etching an opening in said asking layer, said opening defined by at least two opposing sidewalls.

4. The method of claim 1, wherein forming sidewall spacers adjacent said opposing sidewalls of said opening, said sidewall spacers partially defining an exposed surface on said substrate between said sidewall spacers, comprises:

depositing a layer of spacer material above said masking layer and in said opening; and performing an anisotropic etching process on said layer of spacer material.

5. The method of claim 1, wherein forming sidewall spacers adjacent said opposing sidewalls of said opening, said sidewall spacers partially defining an exposed surface on said substrate between said sidewall spacers, comprises forming sidewall spacers comprised of at least one of silicon dioxide and silicon nitride adjacent said opposing sidewalls of said opening, said sidewall spacers partially defining an exposed surface on said substrate between said sidewall spacers.

6. The method of claim 1, wherein forming a gate dielectric layer on said exposed surface of said substrate comprises thermally growing a gate dielectric layer comprised of silicon dioxide on said exposed surface of said substrate.

7. The method of claim 1, wherein forming a layer of polysilicon in said opening and above said gate dielectric layer comprises depositing a layer of polysilicon in said opening and above said gate dielectric layer.

8. The method of claim 1, wherein removing the layer of polysilicon in areas lying outside the opening in said masking layer comprises performing a chemical mechanical polishing operation on said layer of polysilicon.

9. The method of claim 1, wherein removing the layer of polysilicon in areas lying outside the opening in said masking layer comprises:

etching said layer of polysilicon; and performing a chemical mechanical polishing operation on at least portions of said etched layer of polysilicon.

10. The method of claim 1, wherein forming a layer comprised of a refractory metal above said layer of polysilicon in said opening comprises depositing a layer comprised of a refractory metal above said layer of polysilicon in said opening.

11. The method of claim 1, wherein forming a layer comprised of a refractory metal above said layer of polysilicon in said opening comprises forming a layer comprised of a refractory metal comprised of at least one of cobalt, titanium, platinum, and nickel above said layer of polysilicon in said opening.

12. The method of claim 1, wherein converting at least some of said layer of refractory metal to a metal silicide region within said opening comprises performing at least one anneal process.

13. The method of claim 1, wherein converting at least some of said layer of refractory metal to a metal silicide region within said opening comprises performing at least a two-step anneal process.

14. The method of claim 1, wherein removing said masking layer comprises etching said masking layer.

15. A method, comprising:
   forming a masking layer above a semiconducting substrate;
   etching an opening in said masking layer, said opening defined by at least two opposing sidewalls;
   forming sidewall spacers adjacent said opposing sidewalls of said opening, said sidewall spacers partially defining an exposed surface on said substrate between said sidewall spacers;
   thermally growing a gate dielectric layer comprised of silicon dioxide on said exposed surface of said substrate;
   depositing a layer of polysilicon in said opening and above said gate dielectric layer;
   removing the layer of polysilicon in areas lying outside the opening in said masking layer;
   depositing a layer comprised of a refractory metal comprised of at least one of nickel, cobalt, titanium, and platinum above said layer of polysilicon in said opening;
   converting at least some of said layer of refractory metal to a metal silicide region within said opening; and
   removing said masking layer.

16. The method of claim 15, wherein forming a masking layer above a semiconducting substrate comprises forming a masking layer comprised of at least one of silicon dioxide and silicon nitride above a semiconducting substrate.

17. The method of claim 15, wherein forming sidewall spacers adjacent said opposing sidewalls of said opening, said sidewall spacers partially defining an exposed surface on said substrate between said sidewall spacers, comprises:
   depositing a layer of spacer material above said masking layer and in said opening; and
   performing an anisotropic etching process on said layer of spacer material.

18. The method of claim 15, wherein forming sidewall spacers adjacent said opposing sidewalls of said opening, said sidewall spacers partially defining an exposed surface on said substrate between said sidewall spacers, comprises forming sidewall spacers comprised of at least one of silicon dioxide and silicon nitride adjacent said opposing sidewalls of said opening, said sidewall spacers partially defining an exposed surface on said substrate between said sidewall spacers.

19. The method of claim 15, wherein removing the layer of polysilicon in areas lying outside the opening in said masking layer comprises performing a chemical mechanical polishing operation on said layer of polysilicon.

20. The method of claim 15, wherein removing the layer of polysilicon in areas lying outside the opening in said masking layer comprises:
   etching said layer of polysilicon; and
   performing a chemical mechanical polishing operation on at least portions of said etched layer of polysilicon.

21. The method of claim 15, wherein converting at least some of said layer of refractory metal to a metal silicide region within said opening comprises performing at least one anneal process.

22. The method of claim 15, wherein converting at least some of said layer of refractory metal to a metal suicide region within said opening comprises performing at least a two-step anneal process.

23. The method of claim 15, wherein removing said masking layer comprises etching said masking layer.

24. A method, comprising:
   depositing a masking layer comprised of at least one of silicon nitride and silicon dioxide above a semiconducting substrate;
   etching an opening in said masking layer, said opening defined by at least two opposing sidewalls;
   forming sidewall spacers adjacent said opposing sidewalls of said opening, said sidewall spacers partially defining an exposed surface on said substrate between said sidewall spacers;
   thermally growing a gate dielectric layer comprised of silicon dioxide on said exposed surface of said substrate;
   depositing a layer of polysilicon in said opening and above said gate dielectric layer;
   removing the layer of polysilicon in areas lying outside the opening in said masking layer;
   depositing a layer comprised of a refractory metal comprised of at least one of cobalt, titanium, nickel and platinum above said layer of polysilicon in said opening;
   converting at least some of said layer of refractory metal to a metal silicide region within said opening; and
   removing said masking layer.

25. The method of claim 24, wherein forming sidewall spacers adjacent said opposing sidewalls of said opening, said sidewall spacers partially defining an exposed surface on said substrate between said sidewall spacers, comprises:
   depositing a layer of spacer material above said masking layer and in said opening; and
   performing an anisotropic etching process on said layer of spacer material.

26. The method of claim 24, wherein forming sidewall spacers adjacent said opposing sidewalls of said opening, said sidewall spacers partially defining an exposed surface on said substrate between said sidewall spacers, comprises forming sidewall spacers comprised of at least one of silicon dioxide and silicon nitride adjacent said opposing sidewalls of said opening, said sidewall spacers partially defining an exposed surface on said substrate between said sidewall spacers.

27. The method of claim 24, wherein removing the layer of polysilicon in areas lying outside the opening in said masking layer comprises performing a chemical mechanical polishing operation on said layer of polysilicon.

28. The method of claim 24, wherein removing the layer of polysilicon in areas lying outside the opening in said masking layer comprises:
   etching said layer of polysilicon; and
   performing, a chemical mechanical polishing operation on at least portions of said etched layer of polysilicon.

29. The method of claim 24, wherein converting at least some of said layer of refractory metal to a metal silicide region within said opening comprises performing at least one anneal process.

30. The method of claim 24, wherein converting at least some of said layer of refractory metal to a metal silicide region within said opening comprises performing at least a two-step anneal process.

31. The method of claim 24, wherein removing said masking layer comprises etching said masking layer.

* * * * *